US012651730B2

(12) United States Patent
Choi et al.

(10) Patent No.: US 12,651,730 B2
(45) Date of Patent: Jun. 9, 2026

(54) SUBSTRATE PROCESSING APPARATUS INCLUDING EDGE RING ASSEMBLY AND SUBSTRATE PROCESSING METHOD USING THE SAME

(71) Applicant: SAMSUNG ELECTRONICS CO., LTD., Suwon-si (KR)

(72) Inventors: Sungsoo Choi, Suwon-si (KR); Wonyoung Jee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 774 days.

(21) Appl. No.: 18/075,081

(22) Filed: Dec. 5, 2022

(65) Prior Publication Data

US 2023/0207281 A1    Jun. 29, 2023

(30) Foreign Application Priority Data

Dec. 24, 2021    (KR) ........................ 10-2021-0186880

(51) Int. Cl.
H01J 37/32 (2006.01)
H10P 72/72 (2026.01)
H10P 72/76 (2026.01)

(52) U.S. Cl.
CPC .. H01J 37/32642 (2013.01); H01J 37/32715 (2013.01); H10P 72/722 (2026.01); H10P 72/7611 (2026.01)

(58) Field of Classification Search
CPC ............ H01L 21/6833; H01L 21/68735; H01J 37/32642; H01J 37/32715
See application file for complete search history.

(56) References Cited

U.S. PATENT DOCUMENTS

| | | | | |
|---|---|---|---|---|
| 6,159,299 A * | 12/2000 | Koai | ................. | H01L 21/67017 |
| | | | | 118/728 |
| 7,244,336 B2 * | 7/2007 | Fischer | ............. | H01L 21/68735 |
| | | | | 156/345.47 |
| 8,449,679 B2 * | 5/2013 | Dhindsa | ............ | H01L 21/67248 |
| | | | | 156/345.47 |
| 10,672,629 B2 | 6/2020 | Kim et al. | | |
| 10,847,347 B2 * | 11/2020 | Noorbakhsh | ..... | H01L 21/68735 |
| 10,854,492 B2 * | 12/2020 | Bosch | ............... | H01J 37/32532 |
| 11,456,159 B2 * | 9/2022 | Jeong | ................. | H01L 21/6833 |
| 11,798,789 B2 * | 10/2023 | Sanchez | ............ | H01J 37/32642 |

(Continued)

FOREIGN PATENT DOCUMENTS

| | | | | |
|---|---|---|---|---|
| CN | 108538744 A * | 9/2018 | ........ | H01L 21/6833 |
| JP | 2002-246370 A | 8/2002 | | |

(Continued)

*Primary Examiner* — Eric A. Gates
(74) *Attorney, Agent, or Firm* — Sughrue Mion, PLLC

(57) ABSTRACT

A substrate processing apparatus includes a lower plate in a chamber, an electrostatic chuck on the lower plate, the electrostatic chuck including a first step surface, an intermediate ring disposed on the first step surface of the electrostatic chuck, a lower ring surrounding a portion of the intermediate ring and an outer sidewall of the electrostatic chuck on the lower plate, an upper ring covering an upper portion of the intermediate ring, a screw extending through the electrostatic chuck into the lower plate, and a socket connected to each of the screw and the intermediate ring. Each of the screw, the socket and the intermediate ring includes a conductor.

16 Claims, 9 Drawing Sheets

(56) References Cited

U.S. PATENT DOCUMENTS

| | | | | | |
|---|---|---|---|---|---|
| 12,094,752 | B2 * | 9/2024 | Rice | .................... | H01L 21/6831 |
| 12,123,709 | B2 * | 10/2024 | Sadeghi | .................. | C23C 16/50 |
| 12,354,849 | B2 * | 7/2025 | Park | ................. | H01L 21/68742 |
| 2018/0323042 | A1 * | 11/2018 | Wang | .................. | H01L 21/6833 |
| 2019/0229007 | A1 | 7/2019 | Mustafa et al. | | |
| 2020/0020565 | A1 * | 1/2020 | Rathnasinghe | ... | H01J 37/32807 |
| 2020/0234928 | A1 * | 7/2020 | Vishwanath | ...... | H01L 21/68742 |
| 2020/0303224 | A1 * | 9/2020 | Yoshimori | ........ | H01L 21/67259 |
| 2020/0312633 | A1 * | 10/2020 | Rathnasinghe | ..... | H01L 21/6835 |
| 2021/0013014 | A1 | 1/2021 | Sarode Vishwanath | | |
| 2021/0057194 | A1 | 2/2021 | Kon | | |
| 2021/0066052 | A1 * | 3/2021 | Emura | .............. | H01L 21/68742 |
| 2022/0122878 | A1 * | 4/2022 | Wu | .................... | H01L 21/68714 |
| 2022/0285136 | A1 * | 9/2022 | Han | .................. | H01L 21/68735 |
| 2022/0328290 | A1 * | 10/2022 | Mishra | ............. | H01J 37/32385 |

FOREIGN PATENT DOCUMENTS

| | | | | | |
|---|---|---|---|---|---|
| JP | 2010-150605 | A | | 7/2010 | |
| KR | 20060052443 | A | * | 5/2006 | ............. H01L 21/68 |
| KR | 20140004724 | U | * | 8/2014 | ........ H01J 37/32642 |
| KR | 10-2020-0023172 | A | | 3/2020 | |
| KR | 10-2020-0129613 | A | | 11/2020 | |
| KR | 102177146 | B1 | * | 11/2020 | ........ H01J 37/32642 |
| KR | 20220072209 | A | * | 6/2022 | ........ H01J 37/32449 |

* cited by examiner

173(170)

172(170)

171(170)

SUBSTRATE PROCESSING APPARATUS INCLUDING EDGE RING ASSEMBLY AND SUBSTRATE PROCESSING METHOD USING THE SAME

CROSS-REFERENCE TO RELATED APPLICATION

This application claims priority from Korean Patent Application No. 10-2021-0186880, filed on Dec. 24, 2021, in the Korean Intellectual Property Office, the disclosure of which is incorporated herein by reference in its entirety.

BACKGROUND

1. Field

The disclosure relates to a substrate processing apparatus including an edge ring assembly and a substrate processing method using the same.

2. Description of Related Art

In accordance with a fineness and/or a density of a semiconductor device, demand for a pattern structure having a high aspect ratio is increasing. In accordance with enlargement of a substrate, failure may occur in an edge region of the substrate even due to fine variation in plasma uniformity. As a result, yield for the substrate edge region in a plasma process may be considerably reduced. Therefore, development of a substrate processing apparatus using plasma, which is capable of enhancing plasma uniformity, is required.

SUMMARY

The disclosure provides a substrate processing apparatus capable of enhancing a process rate and a production yield by uniformly distributing a plasma density on a substrate in a plasma process for processing a semiconductor substrate using a plasma, and a substrate processing method using the substrate processing apparatus.

In accordance with an aspect of the disclosure, a substrate processing apparatus includes a lower plate in a chamber; an electrostatic chuck on the lower plate, the electrostatic chuck including a first step surface; an intermediate ring disposed on the first step surface of the electrostatic chuck; a lower ring surrounding a portion of the intermediate ring and an outer sidewall of the electrostatic chuck on the lower plate; an upper ring covering an upper portion of the intermediate ring; a screw extending through the electrostatic chuck into the lower plate; and a socket connected to each of the screw and the intermediate ring, wherein each of the screw, the socket and the intermediate ring includes a conductor.

In accordance with an aspect of the disclosure, a substrate processing apparatus includes a lower plate; an electrostatic chuck on the lower plate; an edge ring assembly on the lower plate and the electrostatic chuck; a screw extending through the electrostatic chuck into the lower plate; and a socket connected to each of the screw and the edge ring assembly, wherein a lower portion of the socket is disposed in the screw, and an upper portion of the socket is disposed in the edge ring assembly.

In accordance with an aspect of the disclosure, a substrate processing method includes loading a substrate on an electrostatic chuck in a chamber of a substrate processing apparatus; supplying a process gas onto the substrate in the chamber; providing a high-frequency signal to the electrostatic chuck, thereby producing a plasma; and processing the substrate using the plasma, wherein the substrate processing apparatus includes a lower plate in the chamber, the electrostatic chuck on the lower plate, an intermediate ring disposed on an edge of the electrostatic chuck, a lower ring surrounding a portion of the intermediate ring and an outer sidewall of the electrostatic chuck on the lower plate, an upper ring covering the intermediate ring, a screw extending through the electrostatic chuck into the lower plate, and a socket connected to each of the screw and the intermediate ring.

DETAILED DESCRIPTION OF EMBODIMENTS

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
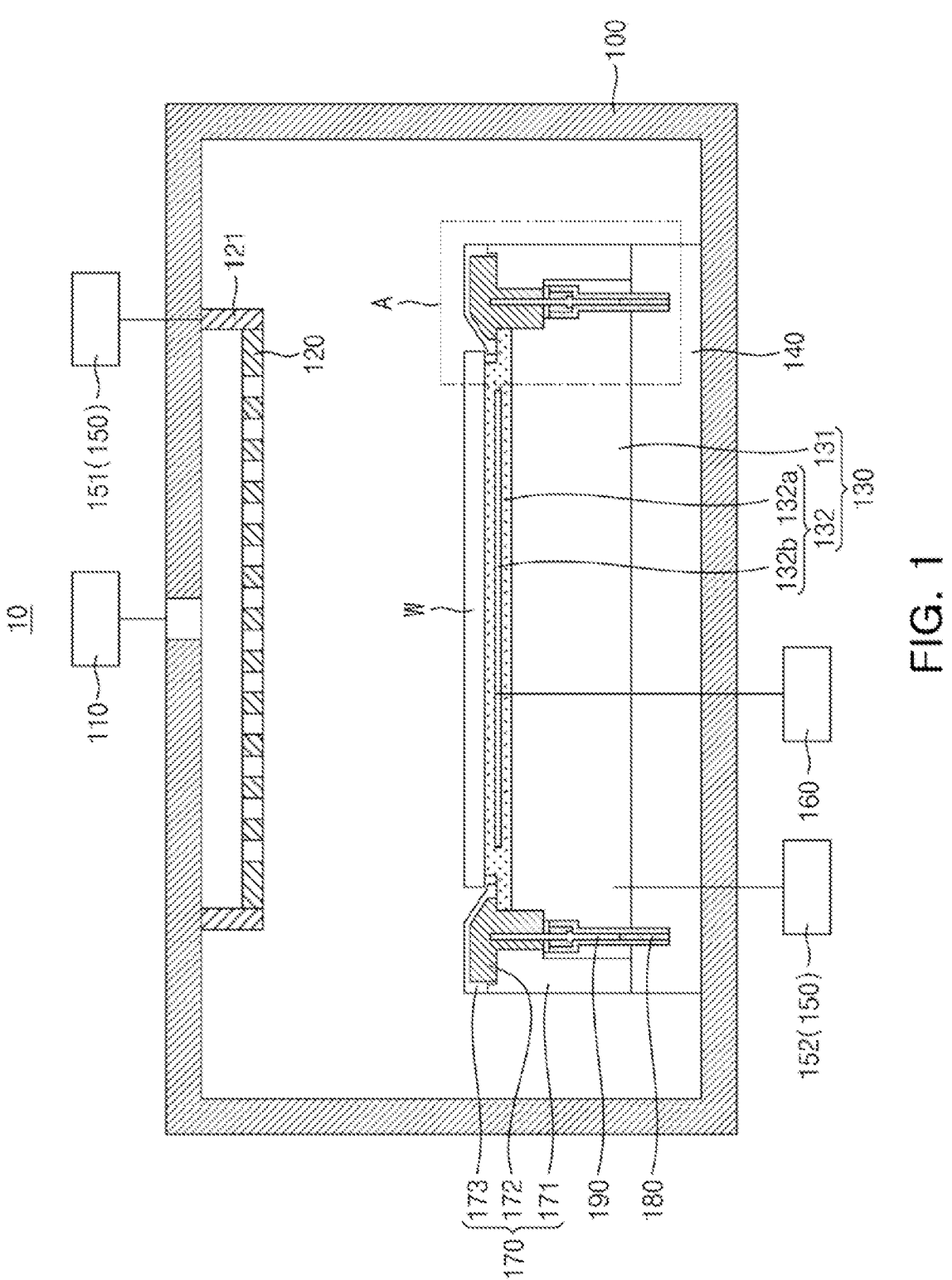
FIG. 1 is a sectional view of a substrate processing apparatus according to an embodiment.

FIG. 1 is a sectional view of a substrate processing apparatus according to an embodiment of the disclosure.

Figure 2:
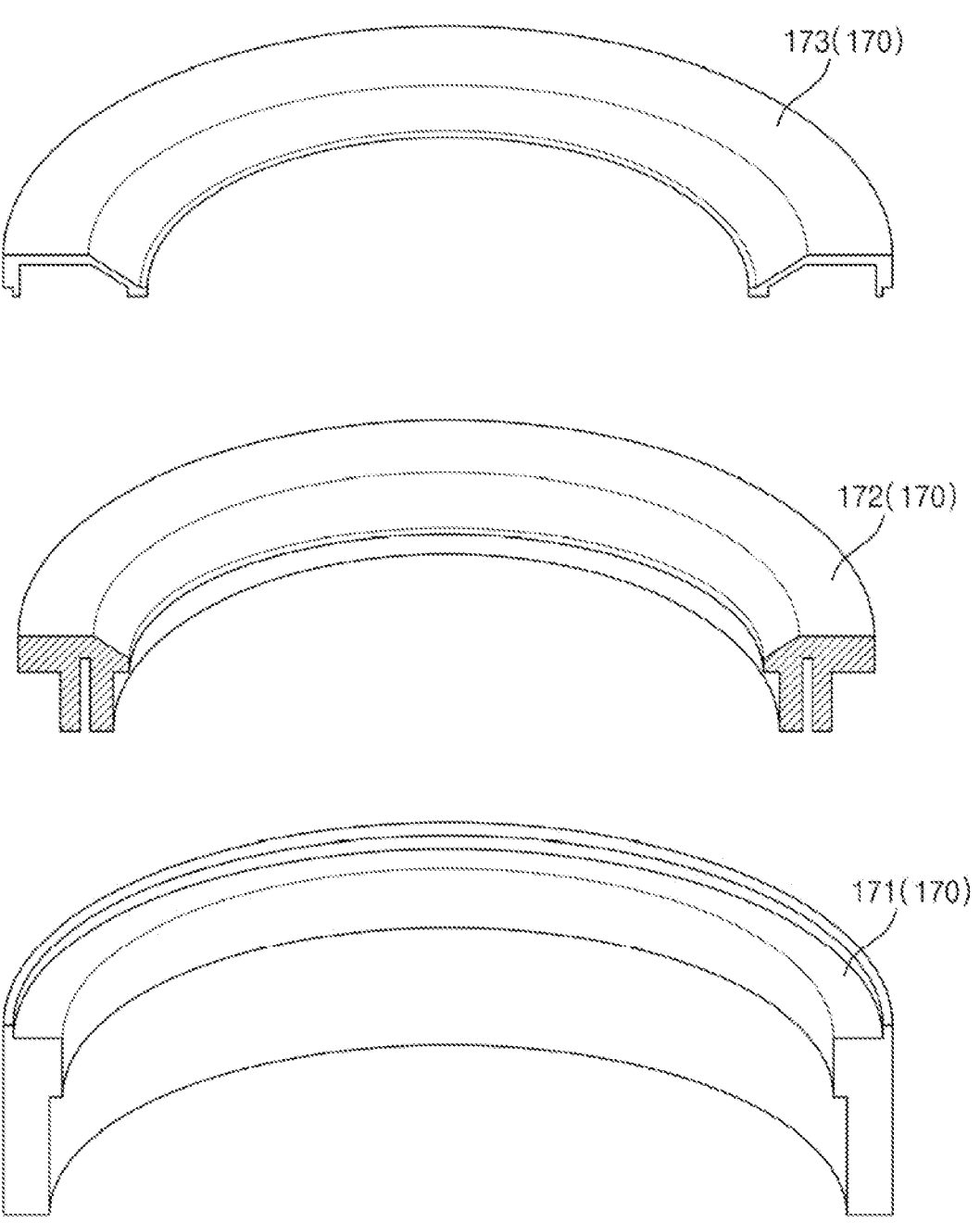
FIG. 2 is an exploded perspective view of cut portions of elements included in the edge ring assembly of FIG. 1.
Figure 3:
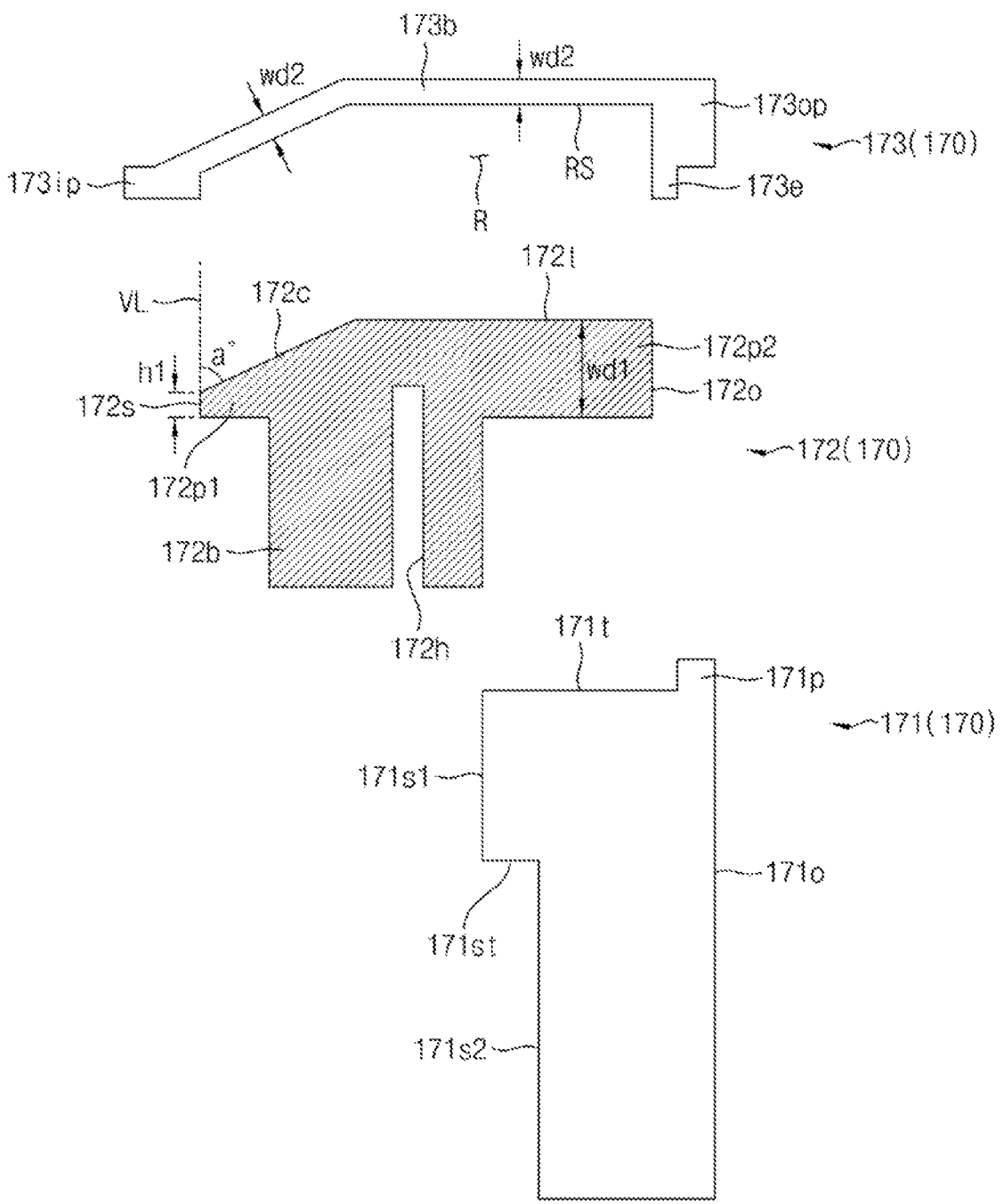
FIG. 3 is an exploded sectional view of the edge ring assembly of FIG. 1.
Figure 4:
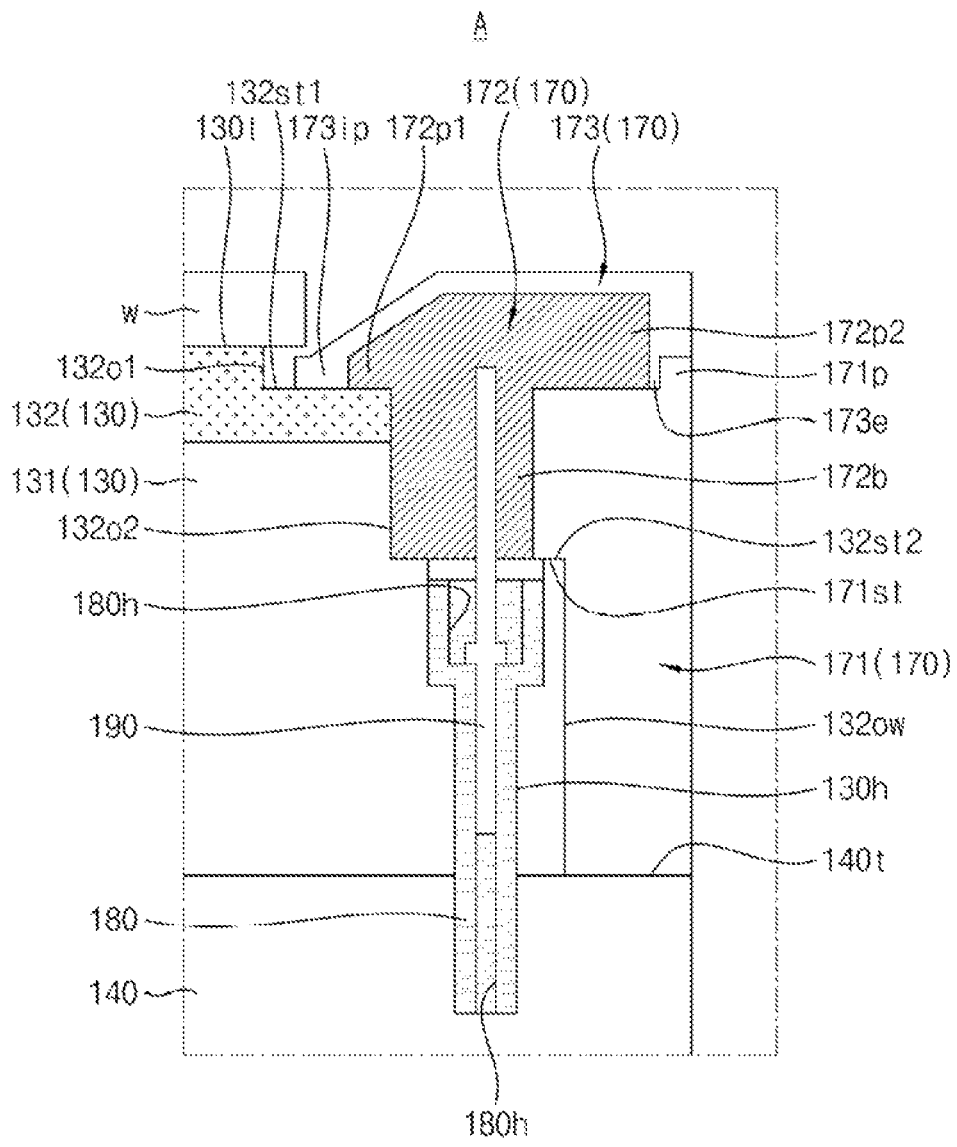
FIG. 4 is an enlarged view of a region A of FIG. 1.

FIG. 2 is an exploded perspective view of cut portions of elements included in the edge ring assembly of FIG. 1. FIG. 3 is an exploded sectional view of the edge ring assembly of FIG. 1. FIG. 4 is an enlarged view of a region A of FIG. 1.

Referring to FIG. 1, a substrate processing apparatus 10 may be an apparatus for performing a process of processing a substrate w (for example, an etching process or a deposition process), for manufacture of a semiconductor device. In an embodiment, the substrate processing apparatus 10 may be a capacitively coupled plasma (CCP) apparatus, an inductively coupled plasma (ICP) apparatus, or a microwave plasma apparatus. For example, the substrate w may be a semiconductor substrate including silicon or germanium, or may be a silicon-on-insulator (SOI) substrate.

In an embodiment, the substrate processing apparatus 10 may include a chamber 100, a gas supplier 110, a shower head 120, an electrostatic chuck 130, a lower plate 140, a high-frequency supplier 150, a DC power supply 160, an edge ring assembly 170, a screw 180, and a socket 190.

The chamber 100 may provide, at an interior thereof, a space in which a plasma process is performed. The inner space of the chamber 100 may be sealed during execution of a plasma process. The chamber 100 may be made of a metal material. For example, the chamber 100 may include aluminum. The chamber 100 may be grounded.

The gas supplier 110 may be connected to the chamber 100. The gas supplier 110 may supply a process gas to the interior of the chamber 100. For example, the process gas may etch the substrate w or a thin film on the substrate w, or may deposit a thin film on the substrate w.

The shower head 120 may be provided in the chamber 100. The shower head 120 may be disposed at an upper portion of the chamber 100. The shower head 120 may inject the process gas supplied by the gas supplier 110 over the entire region of the substrate w. The shower head 120 may include a conductive material. The shower head 120 may include an upper electrode 121.

The electrostatic chuck 130 may be disposed in the chamber 100. The substrate w may be disposed on the electrostatic chuck 130. The electrostatic chuck 130 may support the substrate w. The electrostatic chuck 130 may include a lower electrode 131 and an upper plate 132. The lower electrode 131 may support the upper plate 132. For example, the lower electrode 131 may include aluminum or an aluminum alloy. The upper plate 132 may be disposed on the lower electrode 131. The substrate w may be disposed on the upper plate 132. The upper plate 132 may include a base 132a and an inner electrode 132b. The base 132a may include a dielectric material. For example, the base 132a may include a ceramic, for example, $Al_2O_3$. The inner electrode 132b may be disposed in the base 132a. The base 132a may surround the inner electrode 132b. The inner electrode 132b may include a conductive material and, for example, may include a metal such as nickel (Ni), tungsten (W), tantalum (Ta), etc.

The lower plate 140 may be disposed on a bottom surface of the chamber 100. The lower plate 140 may be disposed between the chamber 100 and the electrostatic chuck 130. The lower plate 140 may be disposed between the chamber 100 and the lower electrode 131. The lower plate 140 may support the electrostatic chuck 130. The lower plate 140 may include an insulating material. For example, the lower plate 140 may include at least one of quartz, $Al_2O_3$, $Y_2O_3$, Si, SiC, C, or $SiO_2$. Accordingly, the lower plate 140 may electrically insulate the electrostatic chuck 130 from the chamber 100.

The high-frequency supplier 150 may provide high-frequency power to the upper electrode 121 of the shower head

120 and to the lower electrode 131 of the electrostatic chuck 130. In an embodiment, the high-frequency supplier 150 may include a first high-frequency supplier 151 connected to the upper electrode 121 or the electrostatic chuck and a second high-frequency supplier 152 connected to the lower electrode 131. The first high-frequency supplier 151 may provide source high-frequency power to the upper electrode 121 or the electrostatic chuck 130. The source high-frequency power may induce a plasma in the chamber 100. The second high-frequency supplier 152 may provide bias high-frequency power to the electrostatic chuck 130. The bias high-frequency power may concentrate a plasma on the substrate w.

The DC power supply 160 may provide a constant voltage to the electrostatic chuck 130. The DC power supply 160 may provide a constant voltage to the upper plate 132 of the electrostatic chuck 130. The DC power supply 160 may provide a constant voltage to the inner electrode 132b of the upper plate 132. The electrostatic chuck 130 may fix the substrate w to the electrostatic chuck 130 using the constant voltage provided from the DC power supply 160. The substrate w may be fixed to the electrostatic chuck 130 in accordance with the Johnsen-Rahbek effect or Coulomb's law of the constant voltage.

The edge ring assembly 170 may be disposed on the electrostatic chuck 130 and the lower plate 140. The edge ring assembly 170 may be disposed at each edge of the electrostatic chuck 130 and the lower plate 140. The edge ring assembly 170 may surround a circumference of the electrostatic chuck 130. The edge ring assembly 170 may include a lower ring 171, an intermediate ring 172, and an upper ring 173.

Referring to FIGS. 1 to 3, each of the lower ring 171, the intermediate ring 172, and the upper ring 173 may have a ring shape. The cross-section of the lower ring 171 may have an L shape. The lower ring 171 may include a first inner surface 171s1 extending downwards from a top surface 171t of the lower ring 171, a step surface 171st extending outwards from a lower end of the first inner surface 171s1, and a second inner surface 171s2 extending downwards from the step surface 171st. In the specification, an outward direction means a direction away from a center line vertically passing through a center of the substrate w when the edge ring assembly 170 is laid on the electrostatic chuck 130 and the lower plate 140, and an inward direction may mean a direction toward the center line. In an embodiment, the lower ring 171 may include a protrusion 171p. The protrusion 171p may protrude upwards from the top surface 171t of the lower ring 171. The protrusion 171p may be formed adjacent to an outer side surface 171o of the lower ring 171. The protrusion 171p may be omitted. The lower ring 171 may include quartz. The lower ring 171 may perform a function of protecting the intermediate ring 172 from a plasma process performed in the chamber 100.

The intermediate ring 172 may include a body portion 172b, a first flange portion 172p1, and a second flange portion 172p2. The first flange portion 172p1 may extend from the body portion 172b in an inward direction. The second flange portion 172p2 may extend from the body portion 172b in an outward direction. The thickness of the first flange portion 172p1 may be varied. The first flange portion 172p1 may gradually increase in thickness as the first flange portion 172p1 extends from an inside thereof to an outside thereof. As shown in FIG. 3, for example, a minimum thickness h1 of the first flange portion 172p1 may be 0.5 to 1.5 mm. The minimum thickness h1 of the first flange portion 127p1 may correspond to a height of a side surface 172s of the first flange portion 172p1. The side surface 172s of the first flange portion 172p1 may be an inner side surface of the intermediate ring 172. A thickness wd1 of the second flange portion 172p2 may be uniform. The thickness wd1 of the second flange portion 172p2 may be about 4 to 5 mm. The intermediate ring 172 may include an inclined surface 172c interconnecting the side surface 172s of the first flange portion 172p1 and a top surface 172t of the intermediate ring 172. The inclined surface 172c may have an inclination of more than 0 degrees, but less than 75 degrees with respect to a vertical line VL disposed on the same line as the side surface 172s of the first flange portion 172p1. The top surface 172t of the first flange portion 172p1 may interconnect the inclined surface 172c and a side surface 172o of the second flange portion 172p2. The side surface 172o of the second flange portion 172p2 may be an outer side surface of the intermediate ring 172. The intermediate ring 172 may include an insertion hole 172h. The insertion hole 172h may extend upwards from a bottom surface of the body portion 172b. The intermediate ring 172 may include a conductor. For example, the intermediate ring 172 may include aluminum.

The cross-section of the upper ring 173 may have an inverted-U shape. The upper ring 173 may include a recess R. In other words, the recess R may be defined by the shape of the upper ring 173. The recess R may have a shape corresponding to an upper portion of the intermediate ring 172. A recessed surface RS defining the recess R may have a shape corresponding to a shape formed by the side surface 172s of the first flange portion 172p1 of the intermediate ring 172, the inclined surface 172c of the intermediate ring 172, the top surface 172t of the intermediate ring 172, and the side surface 172o of the second flange portion 172p2 of the intermediate ring 172. The upper ring 173 may include a body portion 173b, an inner portion 173ip and an outer portion 173op defining the recess R. The body portion 173b may extend along a profile corresponding to the top surface 172t and the inclined surface 172c of the intermediate ring 172. The body portion 173b may be uniform in thickness, and a thickness wd2 of the body portion 173b may be about 0.5 to 1.5 mm. The inner portion 173ip may extend horizontally from an inner end of the body portion 173b in an inward direction. The vertical height of the inner portion 173ip may be greater than the thickness wd2 of the body portion 173b. The outer portion 173op may extend downwards from an outer end of the body portion 173b. The upper ring 173 may include an extension 173e extending downwards from a bottom surface of the outer portion 173op. The extension 173e may be omitted. The upper ring 173 may include quartz. The upper ring 173 may perform a function of protecting the intermediate ring 172 from a plasma process performed in the chamber 100.

Referring to FIG. 4, the substrate w may be disposed on a top surface 130t of the electrostatic chuck 130. The top surface 130t of the electrostatic chuck 130 may support the substrate w. A portion of an edge of the substrate w may not overlap with the top surface 130t of the electrostatic chuck 130. In plan view, the electrostatic chuck 130 may have a smaller area than the lower plate 140 and, as such, the electrostatic chuck 130 may cover only a portion of a top surface 140t of the lower plate 140, and may expose a portion of the edge of the top surface 140t. The electrostatic chuck 130 may include an outer side surface 132o1 extending downwards from the top surface 130t, a first step surface 132st1 extending from a lower end of the first outer side surface 132o1 in an outward direction, a second outer side surface 132o2 extending downwards from an outer end of the first step surface 132st1, a second step surface 132st2 extending from a lower end of the second outer side surface 132o2 in an outward direction, and an outer sidewall 132ow extending downwards from an outer end of the second step surface 132st2. The first step surface 132st1 may be disposed at a higher level than the second step surface 132st2 with reference to the top surface 140t of the lower plate 140.

The lower ring 171 may be disposed on the lower plate 140. The lower ring 171 may be directly disposed on an edge of the top surface 140t of the lower plate 140. A bottom surface of the lower ring 171 may contact the edge of the top surface 140t of the lower plate 140. The lower ring 171 may surround an outer sidewall 132ow of the electrostatic chuck 130. A part of an upper portion of the lower ring 171 may extend on the second step surface 132st2 of the electrostatic chuck 130. The step surface 171st of the lower ring 171 may contact the second step surface 132st2.

The intermediate ring 172 may be disposed on the edge of the electrostatic chuck 130. The intermediate ring 172 may surround the second outer side surface 132o2 of the electrostatic chuck 130. The intermediate ring 172 may be disposed on the second step surface 132st2 of the electrostatic chuck 130. The body portion 172b of the intermediate ring 172 may be directly disposed on the second step surface 132st2. At least a part of the body portion 172b of the intermediate ring 172 may be disposed between the electrostatic chuck 130 and the upper portion of the lower ring 171 on the second step surface 132st2. A least a part of the body portion 172b of the intermediate ring 172 may be surrounded by the upper portion of the lower ring 171. The first flange portion 172p1 of the intermediate ring 172 may be disposed on the first step surface 132st1 of the electrostatic chuck 130. The first flange portion 172p1 of the intermediate ring 172 may not vertically overlap with the substrate w disposed on the electrostatic chuck 130. The second flange portion 172p2 of the intermediate ring 172 may be disposed on the top surface 171t of the lower ring 171. The side surface 172o of the second flange portion 172p2 of the intermediate ring 172 may be spaced apart from the protrusion 171p of the lower ring 171. In an embodiment, the level of the top surface 172t of the intermediate ring 172 may be higher than the level of the top surface 130t of the electrostatic chuck 130 with reference to the top surface 140t of the lower plate 140.

The edge ring assembly 170 of the substrate processing apparatus 10 according to an embodiment of the disclosure may include the intermediate ring 172, which is a conductor, and, as such, may adjust a plasma sheath in order to enable a plasma to uniformly process the substrate win an edge region of the substrate w and in a region of the substrate w other than the edge region. In addition, an equipotential line of the plasma sheath on the substrate w may be varied in accordance with an angle a of the inclined surface 172c of the intermediate ring 172, which is a conductor, with respect to the vertical line VL (see, for example, FIG. 3). Here, the edge region of the substrate may be a region adjacent to the edge of the substrate.

The upper ring 173 may be disposed on the intermediate ring 172. The upper ring 173 may contact the intermediate ring 172 and the lower ring 171, and may contact the first step surface 132st1 of the electrostatic chuck 130. The upper ring 173 may cover the upper portion of the intermediate ring 172. The upper portion of the intermediate ring 172 may be disposed in the recess R of the upper ring 173. The upper ring 173 may completely cover the side surface 172s of the first flange portion 172p1 of the intermediate ring 172, the inclined surface 172c of the intermediate ring 172, the top surface 172*t* of the intermediate ring 172, and the side surface 172*o* of the second flange portion 172*p*2 of the intermediate ring 172. The recessed surface RS of the upper ring 173 may contact the side surface 172*s* of the first flange portion 172*p*1 of the intermediate ring 172, the inclined surface 172*c* of the intermediate ring 172, the top surface 172*t* of the intermediate ring 172, and the side surface 172*o* of the second flange portion 172*p*2 of the intermediate ring 172. The body portion 173*b* of the upper ring 173 may contact the top surface 172*t* and the inclined surface 172*c* of the intermediate ring 172. The inner portion 173*ip* of the upper ring 173 may contact the inner side surface 172*s* of the intermediate ring 172. The outer portion 173*op* of the upper ring 173 may contact the outer side surface 172*o* of the intermediate ring 172. The inner portion 173*ip* of the upper ring 173 may extend between the electrostatic chuck 130 and the substrate w. At least a part of the inner portion 173*ip* of the upper ring 173 may vertically overlap with the substrate w. The outer portion 173*op* of the upper ring 173 may be disposed on the lower ring 171. The extension 173*e* of the upper ring 173 may be interposed between the second flange portion 172*p*2 of the intermediate ring 172 and the protrusion 171*p* of the lower ring 171. The protrusion 171*p* of the lower ring 171 may be disposed outside the extension 173*e*, thereby preventing the upper ring 173 from being shifted outwards.

The screw 180 may be disposed in the electrostatic chuck 130. A portion of the screw 180 may be disposed in a screw hole 130*h* extending through the electrostatic chuck 130. The screw hole 130*h* may be formed to extend through the second step surface 132*st*2 of the electrostatic chuck 130. The screw 180 may be connected to the lower plate 140 while extending through the electrostatic chuck 130. A lower portion of the screw 180 may extend into the lower plate 140. The screw 180 may perform a function of fixing the electrostatic chuck 130 to the lower plate 140. In addition, the screw 180 may perform a function of electrically connecting the electrostatic chuck 130 to the intermediate ring 172 (via the connector 190 which will be described later). The screw 180 may include a conductor and, for example, may include stainless steel. The screw 180 may be vertically spaced apart from the intermediate ring 172, or may contact a bottom surface of the intermediate ring 172.

The connector 190 may be connected to each of the screw 180 and the edge ring assembly 170. The connector 190 may be connected to each of the screw 180 and the intermediate ring 172. The screw 180 may include an inner hole 180*h*, and the connector 190 may be inserted into the inner hole 180*h*. A lower portion of the connector 190 may be disposed in the inner hole 180*h* of the screw 180, and an upper portion of the connector 190 may be disposed in the edge ring assembly 170. The upper portion of the connector 190 may extend upwards into the intermediate ring 172. The upper portion of the connector 190 may be inserted into an insertion hole 172*h* of the intermediate ring 172, and may contact the intermediate ring 172 in the insertion hole 172*h*. The connector 190 may include a conductor and, for example, may include aluminum. The connector 190 may electrically connect the electrostatic chuck 130 to the intermediate ring 172 via the screw 180. As the electrostatic chuck 130 and the intermediate ring 172 are electrically interconnected via the screw 180, a lower electrode for production of a plasma may be extended not only to the electrostatic chuck 130, but also to the intermediate ring 172. As such, respective surfaces of the electrostatic chuck 130 and the intermediate ring 172 may be in an equipotential state in a plasma process in the chamber 100. As a result, a plasma sheath may be adjusted in order to uniformly process the substrate in the edge region of the substrate w and the region of the substrate w other than the edge region.

Figure 5:
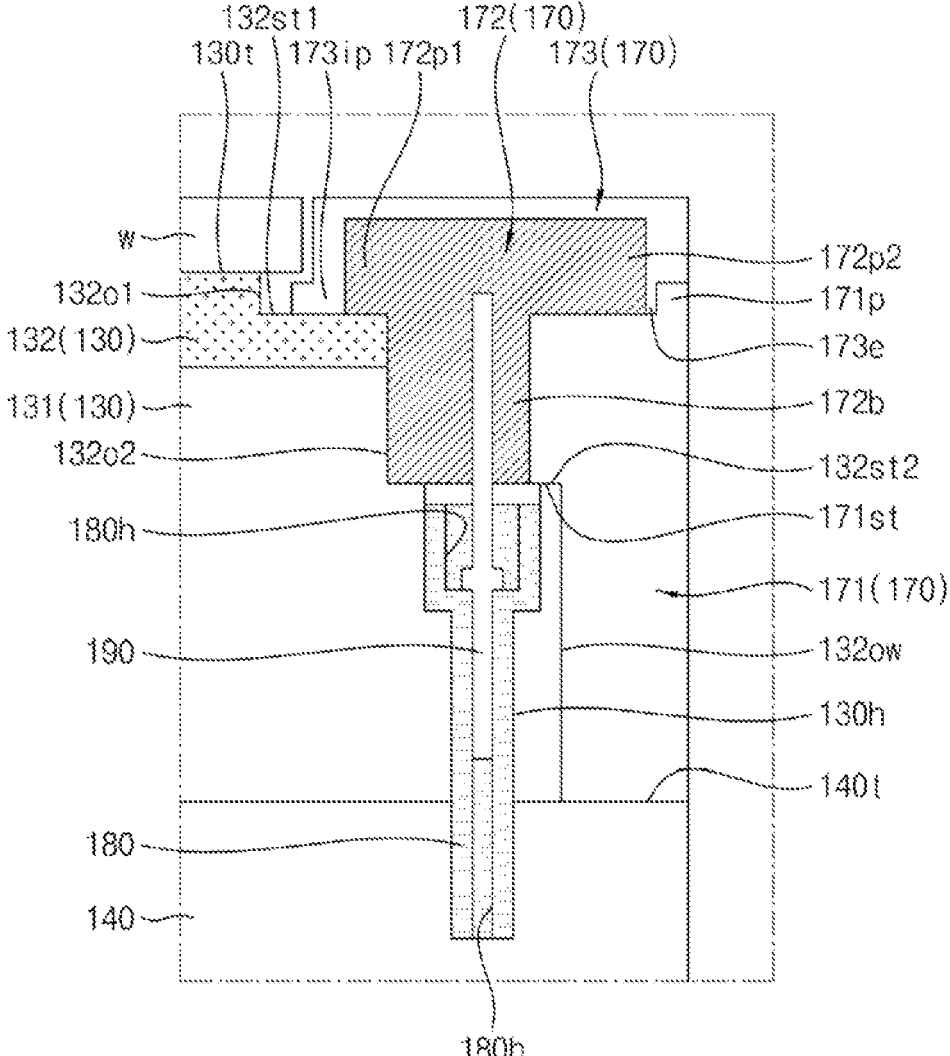
FIG. 5 is an enlarged view showing a part of a substrate processing apparatus according to an embodiment.
Figure 6:
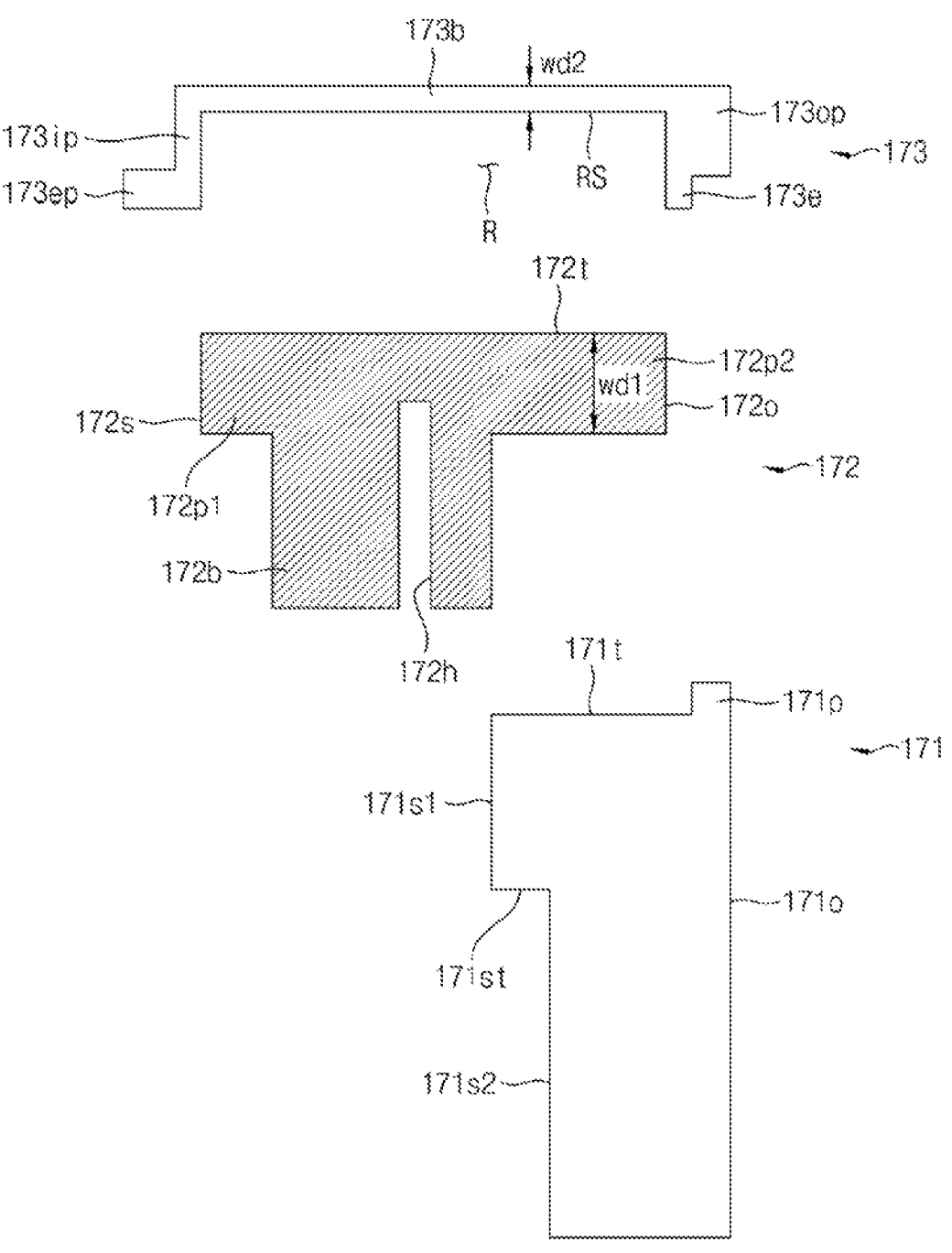
FIG. 6 is an exploded sectional view showing an edge ring assembly of FIG. 5.

FIG. 5 is an enlarged view showing a part of a substrate processing apparatus according to an embodiment of the disclosure. FIG. 6 is an exploded sectional view showing an edge ring assembly of FIG. 5.

Referring to FIGS. 5 and 6, shapes of an intermediate ring 172 and an upper ring 173 in an edge ring assembly 170 included in the substrate processing apparatus in FIGS. 5 and 6 are different from those of the edge ring assembly described with reference to FIGS. 1 to 4.

The intermediate ring 172 may not include an inclined surface, differently from the intermediate ring 172 described with reference to FIGS. 1 to 4. Accordingly, the horizontal thickness of a first flange portion 172*p*1 of the intermediate ring 172 may be uniform. The thickness of the first flange portion 172*p*1 may be equal to the thickness wd1 of the second flange portion 172*p*2 of the intermediate ring 172. Each thickness of the first flange portion 172*p*1 and the second flange portion 172*p*2 may be about 4 to 5 mm. A top surface 172*t* of the intermediate ring 172 may be a flat surface. The top surface 172*t* of the intermediate ring 172 may connect a side surface 172*s* of the first flange portion 172*p*1 to a side surface 172*o* of the second flange portion 172*p*2. That is, the top surface 172*t* of the intermediate ring 172 may connect the inner side surface 172*s* to the outer side surface 172*o* of the intermediate ring 172. In an embodiment, the top surface 172*t* of the intermediate ring 172 may be disposed at a higher level than a top surface 130*t* of an electrostatic chuck 130 with reference to a top surface 140*t* of a lower plate 140.

The cross-section of an upper ring 173 may include an inverted-U shape. The upper ring 173 may include a recess R having a shape corresponding to that of an upper portion of the intermediate ring 172. A recessed surface RS defining the recess R may have a shape corresponding to a shape formed by the side surface 172*s* of the first flange portion 172*p*1 of the intermediate ring 172, the top surface 172*t* of the intermediate ring 172, and the side surface 172*o* of the second flange portion 172*p*2 of the intermediate ring 172. For example, the recess R may have a rectangular cross-section. The upper ring 173 may include a body portion 173*b*, an inner portion 173*ip* and an outer portion 173*op* defining the recess R, and the body portion 173*b* may extend in a horizontal direction along the top surface 172*t* of the intermediate ring 172 such that the body portion 173*b* is flat. A thickness wd2 of the body portion 173*b* may be about 0.5 to 1.5 mm. The inner portion 173*ip* may extend downwards from an inner end of the body portion 173*b*. The outer portion 173*op* may extend downwards from an outer end of the body portion 173*b*. The inner portion 173*ip* may include an extended protrusion 173*ep* extending from a lower end of the inner portion 173*ip* in an inward direction. The inner portion 173*ip* may have an L shape. The vertical height of the extended protrusion 173*ep* may be greater than the thickness wd2 of the body portion 173*b*.

The upper ring 173 may cover an upper portion of the intermediate ring 172. The upper ring 173 may cover the first flange portion 172*p*1 and the second flange portion 172*p*2 of the intermediate ring 172. The upper ring 173 may completely cover the top surface 172*t* of the intermediate ring 172, the side surface 172*s* of the first flange portion 172*p*1, and the side surface 172*o* of the second flange portion 172*p*2. The recessed surface RS of the upper ring 173 may contact the top surface 172*t* of the intermediate ring 172, the side surface 172*s* of the first flange portion 172*p*1, and the side surface 172*o* of the second flange portion 172*p*2. The extended protrusion 173*ep* of the inner portion 173*ip* of the upper ring 173 may be disposed between a substrate w and the electrostatic chuck 130. At least a portion of the extended protrusion 173*ep* may vertically overlap with the substrate w.

Figure 7:
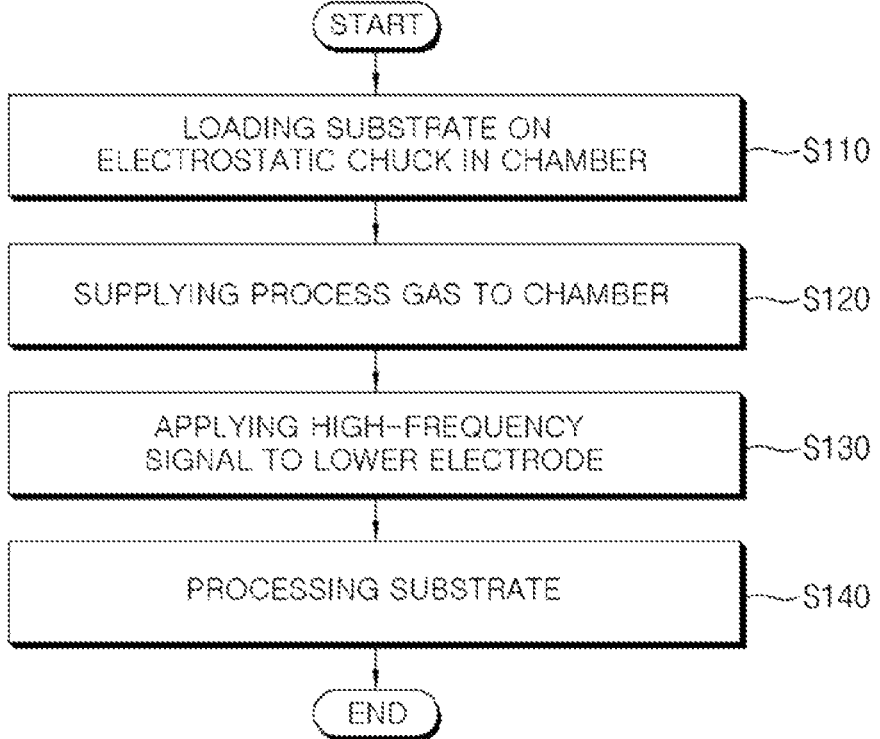
FIG. 7 is a flowchart showing a substrate processing method performed through operation of a substrate processing apparatus in accordance with an embodiment.

FIG. 7 is a flowchart showing a substrate processing method performed through operation of a substrate processing apparatus in accordance with an embodiment of the disclosure.

Referring to FIGS. 1 and 7, the substrate processing method may include loading a substrate w on an electrostatic chuck 130 in a chamber 100 (S110), supplying a process gas to the chamber 100 (S120), applying a high-frequency signal to a lower electrode 131 (S130), and processing the substrate w (S140).

Loading the substrate w on the electrostatic chuck 130 in the chamber 100 (S110) may include introducing the substrate w, which is an object to be processed, into the chamber 100 through a gate from an outside of the chamber 100, disposing the substrate w on the electrostatic chuck 130, and applying electric power to an inner electrode 132*b* through a DC power supplier 160, thereby chucking the substrate w on the electrostatic chuck 130.

Supplying the process gas to the chamber 100 (S120) may include supplying the process gas from a gas supplier 110 to a receiving space of a shower head 120. The process gas may be supplied to a process space in the chamber 100 through an injection hole of the shower head 120.

Applying the high-frequency signal to the lower electrode 131 (S130) may include supplying high-frequency power from a high-frequency supplier 150 to the lower electrode 131, thereby exciting the process gas to a plasma state. The high-frequency supplier 150 may include a first high-frequency supplier 151 and a second high-frequency supplier 152. The first high-frequency supplier 151 may provide source high-frequency power to an upper electrode 121 or the electrostatic chuck 130, thereby inducing a plasma in the chamber 100. The second high-frequency supplier 152 may provide bias high-frequency power to the electrostatic chuck 130, thereby causing the plasma to be concentrated on the substrate w.

Although application of the high-frequency signal to the lower electrode 131 (S130) is shown in FIG. 7 as being performed after supply of the process gas to the chamber 100 (S120), embodiments of the disclosure are not limited thereto, and the two operations may be reversely performed. In any case, the substrate processing method according to an embodiment of the disclosure includes producing a plasma in the chamber 100 by applying high-frequency power to the electrostatic chuck 130 and/or the shower head 120 and, at the same time, injecting the process gas into the chamber 100 through the shower head 120.

Processing the substrate w (S140) may include processing the substrate w and/or an object, to be processed, on the substrate w using the produced plasma. For example, when the process of processing the substrate w is an etching process, processing the substrate w may include etching the substrate w or the etching object on the substrate w using the plasma, thereby forming a pattern on the substrate w.

After processing of the substrate w is completed, a residual gas in the chamber may be exhausted to the outside of the chamber 100 through an exhaust hole. A byproduct may be included in the residual gas. The substrate w may be de-chucked from the electrostatic chuck 130, and may then be recovered from the chamber 100.

Figure 8A:
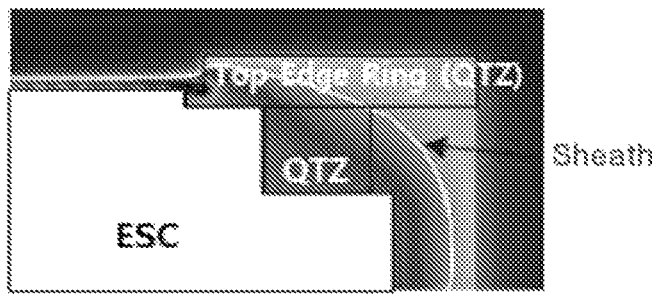
FIGS. 8A, 8B, 9A, and 9B illustrate effects of a substrate processing apparatus according to an embodiment.
Figure 8B:
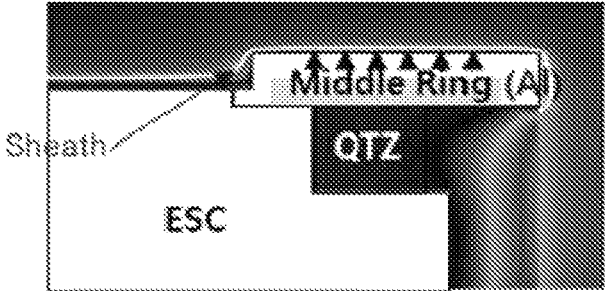

FIGS. 8A and 8B illustrate effects of a substrate processing apparatus according to an embodiment of the disclosure.

FIG. 8A shows an equipotential line of a plasma sheath in an edge of an electrostatic chuck in the case in which an edge ring assembly does not include a conductor. FIG. 8B shows an equipotential line of a plasma sheath in an edge of an electrostatic chuck in the case in which an edge ring assembly includes an intermediate ring, which is a conductor (for example, aluminum), as in embodiments of the disclosure. In the case of FIG. 8A, it was found that the equipotential line is gradually lowered along step surfaces of the electrostatic chuck. In the case of FIG. 8B, a potential difference occurs because the edge ring assembly, which includes quartz, has relatively high resistivity, as compared to the electrostatic chuck, and, as such, it was found that the equipotential line of the plasma sheath is formed over the edge ring assembly. As a result, a high-density plasma zone may be formed beyond an edge region of a substrate and, as such, the entire region of the substrate may be uniformly processed by the plasma.

Figure 9A:
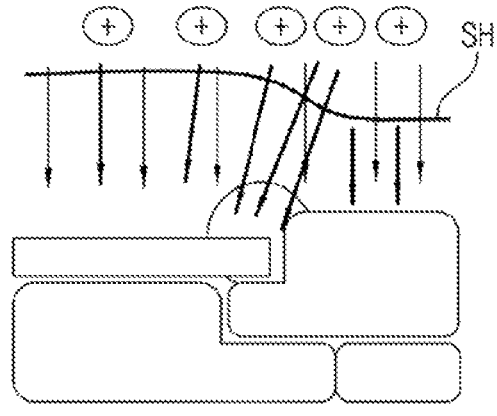
Figure 9B:
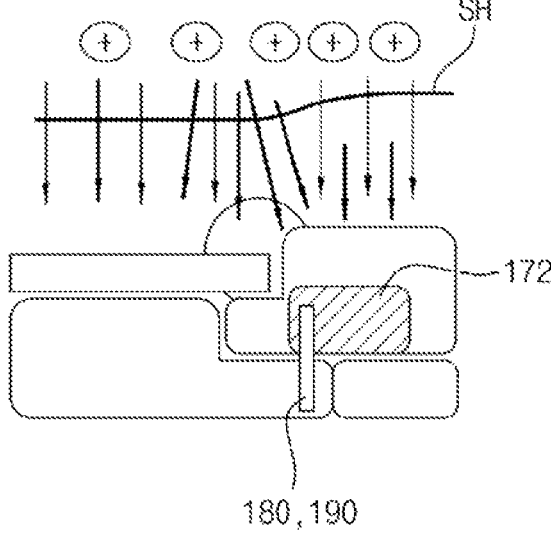

FIGS. 9A and 9B illustrate effects of a substrate processing apparatus according to an embodiment of the disclosure.

FIG. 9A shows an equipotential line SH of a plasma sheath on an edge of a substrate in the case in which an edge ring assembly does not include a conductor. FIG. 9B shows an equipotential line SH of a plasma sheath on an edge of a substrate in the case in which an edge ring assembly includes an intermediate ring 172, which is a conductor (for example, aluminum), and the intermediate ring 172 is electrically connected to an electrostatic chuck by a socket 190 and a screw 180, as in embodiments of the disclosure.

In the case of FIG. 9A, the equipotential line SH of the plasma sheath may not be horizontally formed over the edge of the substrate, and may include a portion gradually lowered as the equipotential line SH extends toward an outside of the substrate, due to an impedance difference between the electrostatic chuck and the edge ring assembly. As a result, when a process gas in a plasma state is accelerated toward the substrate, the process gas may not be vertically incident, but may be inclinedly incident and, as such, a high-density plasma zone having a higher plasma density may be formed in an edge region of the substrate, as compared to other regions of the substrate.

On the other hand, in the case of FIG. 9B, a lower electrode for production of a plasma may extend from the electrode chuck to the intermediate ring 172 of the edge ring assembly and, as such, the plasma sheath may be formed to include a portion at which the equipotential line SH of the plasma sheath is gradually raised over the edge of the substrate. Accordingly, a high-density plasma zone may be formed outside an edge region of the substrate and, as such, it may be possible to uniformly process the entire region of the substrate using the plasma.

In accordance with embodiments of the disclosure, in a substrate processing apparatus, it may be possible to adjust a plasma sheath such that the entire region of a substrate is uniformly processed by a plasma, by reducing an impedance difference for a high-frequency signal between an electrostatic chuck, on which the substrate is seated, and an edge ring assembly disposed at an edge of the electrostatic chuck, and extending a lower electrode for production of a plasma to an intermediate ring of the edge ring assembly.

While embodiments of the disclosure have been described with reference to the accompanying drawings, it should be understood by those skilled in the art that various modifications may be made without departing from the scope of the disclosure and without changing essential features thereof.

Therefore, the above-described embodiments should be considered in a descriptive sense only and not for purposes of limitation.

What is claimed is:

1. A substrate processing apparatus comprising:
a lower plate in a chamber;
an electrostatic chuck on the lower plate, the electrostatic chuck comprising a first step surface;
an intermediate ring disposed on the first step surface of the electrostatic chuck;
a lower ring surrounding a portion of the intermediate ring and an outer sidewall of the electrostatic chuck on the lower plate;
an upper ring covering an upper portion of the intermediate ring;
a screw extending through the electrostatic chuck into the lower plate; and
a connector connected to each of the screw and the intermediate ring,
wherein each of the screw, the connector and the intermediate ring comprises a conductor.

2. The substrate processing apparatus according to claim 1, wherein:
the screw comprises an inner hole;
the intermediate ring comprises an insertion hole; and
a lower portion of the connector is inserted into the inner hole, and an upper portion of the connector is inserted into the insertion hole.

3. The substrate processing apparatus according to claim 1, wherein:
the electrostatic chuck comprises a screw hole extending through the first step surface; and
a portion of the screw is disposed in the screw hole.

4. The substrate processing apparatus according to claim 1, wherein:
the electrostatic chuck comprises a second step surface at a level higher than a level of the first step surface;
the intermediate ring comprises:
a first flange portion disposed on the second step surface, and
a second flange portion disposed on the lower ring; and
a thickness of the second flange portion is 4 to 5 mm.

5. The substrate processing apparatus according to claim 1, wherein the intermediate ring further comprises an inclined surface connecting a top surface of the intermediate ring to an inner side surface of the intermediate ring.

6. The substrate processing apparatus according to claim 1, wherein:
the upper ring comprises:
a body portion contacting a top surface of the intermediate ring,
an inner portion contacting an inner side surface of the intermediate ring, and
an outer portion contacting an outer side surface of the intermediate ring;

a recess is defined by the body portion, the inner portion and the outer portion; and
a thickness of the body portion is 0.5 to 1.5 mm.

7. The substrate processing apparatus according to claim 6, wherein an upper portion of the intermediate ring is disposed in the recess.

8. The substrate processing apparatus according to claim 1, wherein a level of a top surface of the intermediate ring is higher than a level of a top surface of the electrostatic chuck.

9. The substrate processing apparatus according to claim 1, wherein each of the upper ring and the lower ring comprises quartz.

10. A substrate processing apparatus comprising:
a lower plate;
an electrostatic chuck on the lower plate;
an edge ring assembly on the lower plate and the electrostatic chuck;
a screw extending through the electrostatic chuck into the lower plate; and
a connector connected to each of the screw and the edge ring assembly,
wherein a lower portion of the connector is disposed in the screw, and an upper portion of the connector is disposed in the edge ring assembly.

11. The substrate processing apparatus according to claim 10, wherein the edge ring assembly comprises:
an intermediate ring disposed on an edge of the electrostatic chuck;
a lower ring surrounding a portion of the intermediate ring and an outer sidewall of the electrostatic chuck on the lower plate; and
an upper ring covering the intermediate ring.

12. The substrate processing apparatus according to claim 11, wherein the connector is connected to the intermediate ring.

13. The substrate processing apparatus according to claim 11, wherein the intermediate ring comprises:
a first flange portion disposed on a step surface of the electrostatic chuck; and
a second flange portion disposed on the lower ring.

14. The substrate processing apparatus according to claim 11, wherein the intermediate ring comprises an inclined surface connecting a top surface of the intermediate ring to an inner side surface of the intermediate ring.

15. The substrate processing apparatus according to claim 11, wherein:
each of the lower ring and the upper ring comprises quartz; and
the intermediate ring comprises a conductor.

16. The substrate processing apparatus according to claim 11, wherein each of the intermediate ring and the connector comprises aluminum or an aluminum alloy.

* * * * *